(12) United States Patent
Sasaki et al.

(10) Patent No.: US 11,378,303 B2
(45) Date of Patent: Jul. 5, 2022

(54) HUMIDIFIER AND AIR CONDITIONER

(71) Applicant: SHINWA CONTROLS CO., LTD, Kawasaki (JP)

(72) Inventors: Isamu Sasaki, Kawasaki (JP); Kazushige Takahira, Kawasaki (JP)

(73) Assignee: Shinwa Controls Co., Ltd, Kawasaki (JP)

( * ) Notice: Subject to any disclaimer, the term of this patent is extended or adjusted under 35 U.S.C. 154(b) by 580 days.

(21) Appl. No.: 16/343,548

(22) PCT Filed: Nov. 8, 2017

(86) PCT No.: PCT/JP2017/040241
§ 371 (c)(1),
(2) Date: Apr. 19, 2019

(87) PCT Pub. No.: WO2018/088427
PCT Pub. Date: May 17, 2018

(65) Prior Publication Data
US 2019/0242613 A1 Aug. 8, 2019

(30) Foreign Application Priority Data
Nov. 10, 2016 (JP) .............................. JP2016-219832

(51) Int. Cl.
*B01F 23/00* (2022.01)
*F24F 3/14* (2006.01)
(Continued)

(52) U.S. Cl.
CPC .............. *F24F 13/08* (2013.01); *B01F 23/00* (2022.01); *F24F 3/14* (2013.01); *F24F 6/00* (2013.01);
(Continued)

(58) Field of Classification Search
CPC ..... F24F 3/14; F24F 6/08; F24F 6/025; B01F 3/04; B01F 23/00
See application file for complete search history.

(56) References Cited

U.S. PATENT DOCUMENTS

| 1,839,234 A | * | 1/1932 | Lehn ........................ F24F 6/04 |
| | | | 261/153 |
| 5,193,354 A | | 3/1993 | Kleinberger et al. |
| 5,653,919 A | | 8/1997 | White |

FOREIGN PATENT DOCUMENTS

| CN | 104110728 A | 10/2014 |
| JP | S51-060158 U | 5/1976 |

(Continued)

OTHER PUBLICATIONS

Chinese Office Action (Application No. 201780068759.5) dated Jun. 19, 2020 (with English translation).
(Continued)

*Primary Examiner* — Robert A Hopkins
(74) *Attorney, Agent, or Firm* — Burr & Brown, PLLC

(57) ABSTRACT

The present invention provides a humidifier capable of preventing water generated by dew condensation of vapor from being combined with air, so that an air humidity can be stably controlled. A humidifier according to the present invention includes a storage tank that stores water, the storage tank being opened upward, a heater that heats the water in the storage tank, and a guide plate that is disposed above the storage tank, on at least one of one side and the other side in a first direction extending along a horizontal direction with respect to a center of the storage tank. The guide plate extends in an inclined manner such that an upper part thereof is positioned closer to the center of the storage tank in the first direction than a lower part thereof.

20 Claims, 6 Drawing Sheets

(51) Int. Cl.
  *F24F 13/08*   (2006.01)
  *F24F 6/08*   (2006.01)
  *G03F 7/20*   (2006.01)
  *H01L 21/027*  (2006.01)
  *F24F 6/00*   (2006.01)
  *F24F 6/02*   (2006.01)

(52) U.S. Cl.
  CPC ............... *F24F 6/025* (2013.01); *F24F 6/08* (2013.01); *G03F 7/20* (2013.01); *G03F 7/70* (2013.01); *H01L 21/027* (2013.01); *F24F 2006/008* (2013.01)

(56) References Cited

FOREIGN PATENT DOCUMENTS

| | | |
|---|---|---|
| JP | S54-166058 U | 11/1979 |
| JP | 3053965 U | 11/1998 |
| JP | 2001-317770 A1 | 11/2001 |
| JP | 2004-216221 A1 | 8/2004 |
| JP | 2007-335544 A1 | 12/2007 |
| JP | 2010-236742 A1 | 10/2010 |
| KR | 20-1997-006598 U | 2/1997 |
| KR | 10-2006-0015673 A | 10/2006 |

OTHER PUBLICATIONS

International Search Report and Written Opinion (Application No. PCT/JP2017/040241) dated Jan. 23, 2018.

English translation of International Preliminary Report on Patentability (Chapter I) (Application No. PCT/JP2017/040241) dated May 23, 2019, 8 pages.

\* cited by examiner

HUMIDIFIER AND AIR CONDITIONER

FIELD OF THE INVENTION

The present invention relates to a humidifier and an air conditioner comprising the same.

BACKGROUND OF THE INVENTION

In a pattern forming step in the manufacture of a semiconductor, a photolithography is sometimes utilized. In the photolithography, a photosensitive resist is applied to a substrate, and then the resist is exposed to light corresponding to a desired pattern. When the resist is a photo-curing type photosensitive material, for example, an area of the resist, which is not exposed to light, is removed by a solvent. Thus, the desired pattern can be formed (developed) on the resist.

It is known that a film thickness of such a resist applied or exposure may change, depending on a temperature and a humidity. Thus, when a temperature and a humidity of air in an environment surrounding the resist largely differ from a desired temperature and a humidity, dimensional precision of a formed pattern may be significantly lowered. Thus, in general, a temperature and a humidity of an apparatus for performing the photolithography and its surrounding environment are precisely controlled by an air conditioner.

In the field of air conditioners for precisely controlling a temperature and a humidity as described above, various techniques have been proposed heretofore. For example, Patent Document 1 discloses an apparatus in which a mesh-like member is accommodated in a pan, in order to prevent shaking of water stored in the pan. In this apparatus, the precision of the humidity control is improved by preventing shaking of water stored in the pan.

Patent Document 1: JP2007-335544A

As an example of an air conditioner for precisely controlling a temperature and a humidity, an air conditioner is known, which comprises an air flow path through which air flows, a cooler, a heater and a humidifier, which are accommodated in the air flow path, wherein a temperature and a humidity of air are controlled in the air flow path. Such an air conditioner sometimes employs a structure in which a metal plate with an air through hole is installed in a downstream opening of the air flow path, so that air in the air flow path is made to flow downward through the air through hole.

However, the present inventor has found that a humidity spike is likely to occur in the air conditioner employing the aforementioned structure. The humidity spike means a phenomenon in which an air humidity instantaneously deviates seriously from a target value. The present inventor has conducted extensive studies and found that the humidity spike is mainly caused by the fact that vapor from the humidifier condenses on a wall surface around the through hole of the aforementioned plate, and the water generated on the wall surface combines with air so as to flow downstream.

The present invention has been made in view of the above finding. The object of the present invention is to provide a humidifier and an air conditioner capable of preventing water generated by dew condensation of vapor from being combined with air so as to stably control an air humidity.

SUMMARY OF THE INVENTION

The present invention is:
a humidifier comprising:

a storage tank that stores water, the storage tank being opened upward;
a heater that heats the water in the storage tank; and
a guide plate that is disposed above the storage tank, on at least one of one side and the other side in a first direction extending along a horizontal direction, with respect to a center of the storage tank, the guide plate extending in an inclined manner such that an upper part thereof is positioned closer to the center of the storage tank in the first direction, than a lower part thereof.

The humidifier according to the present invention allows air, which comes from a direction intersecting the first direction on a horizontal plane to pass through above the storage tank, to be combined with vapor from the storage tank, and enables the air combined with vapor to go outside the storage tank, while the air is guided by the guide plate toward the center side of the storage tank. Thus, the air combined with vapor can be gathered in a desired area outside the storage tank, which is positioned on an extension line of the guide plate when seen along a direction orthogonal to the first direction on the horizontal plane. On the other hand, it can be prevented that the air combined with vapor diffuses broadly and condenses on an undesired area. As a result, it can be prevented that water generated by dew condensation of vapor is combined with air, whereby air humidity can be stably controlled.

In the humidifier according to the present invention, the guide plate may have an inclined side part that is positioned such that, in a top view, an end thereof, which is on one side of a second direction orthogonal to the first direction in a horizontal plane, is more distant from the center of the storage tank in the first direction, than an end thereof which is on the other side of the second direction.

In this case, air combined with vapor is allowed to pass through a desired area outside the storage tank, while the air combined with vapor is guided to the center side of the storage tank along the inclined side part. Thus, the air combined with vapor, which is present broadly in an area of the storage tank on the one side of the second direction can be supplied to the desired area outside the storage tank. Thus, it can be effectively prevented that the air combined with vapor diffuses broadly, and undesired dew condensation of vapor can be effectively prevented.

In addition, in the humidifier according to the present invention, the guide plate may have the other side part facing the other side of the second direction in a horizontal plane, and the other side part may extend along the first direction.

In this case, as compared with a case in which the other side part is inclined with respect to the first direction, it can be better prevented that vapor from the storage tank leaks outside from the other side part.

In addition, in the humidifier according to the present invention, a wall part of the storage tank on other side of the second direction may extend along the first direction, and in a top view, the other side part may be overlapped with the wall part or may be positioned outside the wall part.

In this case, it can be effectively prevented that vapor from the storage tank leaks outside from the other side part.

In addition, in the humidifier according to the present invention, the other side part may be provided with a projection that projects downward and extends along the other side part.

In this case, due to the projection, it can be prevented that vapor from the storage tank leaks outside from the other side part, and water generated by the vapor condensed on the lower surface of the guide plate can be returned to the storage tank from the lower end of the projection. In addition, since the guide plate can be prevented from being bent and deformed by the projection, fluttering of the guide plate, which may be caused by flow of air, can be prevented.

In addition, in the humidifier according to the present invention, the guide plate may be disposed such that, in a top view, a gap is defined between the guide plate and a wall part of the storage tank on a side on which the guide plate itself is positioned in the first direction.

In this case, a member such as a float switch can be arranged through the gap between the guide plate and the wall part of the storage tank on the side on which this guide plate is positioned. Further, while the gap is efficiently utilized, the gap is positioned apart from the desired area outside the center of the storage tank to which air is supplied. Thus, even when vapor of the storage tank condenses on an undesired area, flow of water into the desired area can be prevented.

In the humidifier according to the present invention, the guide plate may be disposed on both the one side and the other side of the first direction, with respect to the center of the storage tank, and a pair of the guide plates may be symmetric with reference to a vertical plane that passes the center of the storage tank in the first direction and extends along a second direction orthogonal to the first direction.

In this case, as compared with a case in which the number of guide plate(s) is one, it can be more effectively prevented that water generated by dew condensation of vapor is combined with air, whereby air humidity can be stably controlled.

In addition, the present invention is:
an air conditioner comprising:
an air flow path through which air flows;
a plate installed in a downstream opening of the air flow path, the plate being provided with an air through hole; and
a humidifier disposed on the air flow path and capable of supplying vapor into the air flow path;
wherein:
the air flow path has a horizontal channel provided with the downstream opening and extending along a horizontal direction;
the humidifier is disposed on the horizontal channel;
the humidifier has:
a storage tank that stores water, the storage tank being opened upward;
a heater that heats the water in the storage tank; and
a guide plate that is disposed above the storage tank, on at least one of one side and the other side in a first direction extending along a horizontal direction, with respect to a center of the storage tank, the guide plate extending in an inclined manner such that an upper part thereof is positioned closer to the center of the storage tank in the first direction, than a lower part thereof; and
the humidifier is configured to be installed such that a second direction orthogonal to the first direction in a horizontal plane is along an extension direction of the horizontal channel.

The air conditioner according to the present invention allows air, which comes from a direction intersecting the first direction on a horizontal plane in the horizontal channel of the air flow path to pass through above the storage tank, to be combined with vapor from the storage tank, and enables the air combined with vapor to go outside the storage tank, while the air is guided by the guide plate toward the center side of the storage tank. Thus, under a state in which the humidifier is set such that the air through hole of the plate is positioned on the extension lines of the guide plates when seen along a direction orthogonal to the first direction on a horizontal plane, i.e., along the second direction, the air combined with vapor can be gathered in the air through hole of the plate. On the other hand, it can be prevented that the air combined with vapor diffuses broadly and condenses on an undesired area, specifically, an area around the air through hole of the plate. As a result, it can be prevented that water generated by dew condensation of vapor is combined with air, whereby air humidity can be stably controlled.

In the air conditioner according to the present invention, the guide plate may have an inclined side part that is positioned such that, in a top view, an end thereof, which is on one side of a second direction orthogonal to the first direction in a horizontal plane, is more distant from the center of the storage tank in the first direction, than an end thereof which is on the other side of the second direction, and the plate may be positioned on the other side of the second direction with respect to the humidifier.

In this case, air combined with vapor is allowed to pass through the air though hole of the plate outside the storage tank, while the air combined with vapor is guided to the center side of the storage tank along the inclined side part. Thus, the air combined with vapor, which is present broadly in an area of the storage tank on the one side of the second direction can be supplied to the air though hole of the plate. Thus, it can be effectively prevented that the air combined with vapor diffuses broadly, and undesired dew condensation of vapor can be effectively prevented.

In addition, in the air conditioner according to the present invention, the guide plate may have the other side part facing the other side of the second direction, and the other side part may extend along the first direction.

In this case, as compared with a case in which the other side part is inclined with respect to the first direction, it can be better prevented that vapor from the storage tank leaks outside from the other side part.

In addition, in the air conditioner according to the present invention, a wall part of the storage tank on the other side of the second direction may extend along the first direction, and in a top view, the other side part may be overlapped with the wall part or may be positioned outside the wall part.

In this case, it can be prevented that vapor from the storage tank leaks outside from the other side part.

In addition, in the air conditioner according to the present invention, the other side part may be provided with a projection that projects downward and extends along the other side part.

In this case, due to the projection, it can be prevented that vapor from the storage tank leaks outside from the other side part, and water generated by the vapor condensed on the lower surface of the guide plate can be returned to the storage tank from the lower end of the projection. In addition, since the guide plate can be prevented from being bent and deformed by the projection, fluttering of the guide plate, which may be caused by flow of air, can be prevented.

In addition, the air conditioner according to the present invention may further comprise a moisture absorption member that extends in an up and down direction, above a wall part of the storage tank on the other side of the second direction, or diagonally thereabove on the other side of the second direction.

In this case, a part of vapor from the storage tank can be held in a water condition by the moisture absorption member, so that it can be prevented that the vapor condenses around the air through hole of the plate. In particular, vapor coming from the storage tank on the side of the plate is likely to be combined with air so as to adhere to the periphery of the air thought hole to form dew drops. However, since the moisture absorption member is positioned on the side of the plate of the storage tank, dew condensation of vapor can be efficiently prevented. In addition, even when vapor from the storage tank leaks outside from the other side part, the vapor can be held in a water condition by the moisture absorption member. Thus, it can be effectively prevented that the vapor that has leaked outside from the other side part condenses and is combined with air to flow. Thus, air humidity can be more stably controlled.

In addition, in the air conditioner according to the present invention, the guide plate may be disposed such that, in a top view, a gap is defined between the guide plate and a wall part of the storage tank on a side on which the guide plate itself is positioned in the first direction.

In this case, a member such as a float switch can be arranged through the gap between the guide plate and the wall part of the storage tank on the side on which this guide plate is positioned. Further, while the gap is efficiently utilized, the humidifier is disposed such that the gap is positioned apart from the air through hole of the plate to which air is supplied. Thus, even when vapor of the storage tank condenses on an undesired area, flow of water into the desired area can be prevented.

In addition, in the air conditioner according to the present invention, when seen along the second direction, a part of the guide plate may be overlapped with the air through hole.

In this case, air combined with vapor, which is guided by the guide plate, can be effectively prevented from spreading around the air through hole of the plate. Thus, it can be prevented that water generated by dew condensation of vapor is combined with air.

In addition, in the air conditioner according to the present invention, when seen along the second direction, an extension line of the guide plate may pass a center of the air through hole.

In this case, air combined with vapor, which is guided by the guide plates, can be supplied toward the center of the air through hole of the plate. Thus, the air combined with vapor can be effectively prevented from spreading around the air through hole of the plate. As a result, it can be prevented that water generated by dew condensation of vapor is combined with air.

In addition, in the air conditioner according to the present invention:
the air through hole may be circular;
when seen along the second direction, a part of the guide plate may be overlapped with the air through hole; and
a distance, in which the guide plate projects from an end point of the air through hole in the first direction toward the center of the air through hole in the first direction, may be $5/36$ to $10/36$ with respect to a diameter of the air through hole.

From extensive studies, the present inventor has found that, when the distance, in which the guide plate projects from an end point of the air through hole in the first direction toward the center of the air through hole in the first direction, is $5/36$ to $10/36$ with respect to a diameter of the air through hole, air combined with vapor can be extremely effectively prevented from spreading around the air through hole of the plate.

In addition, in the air conditioner according to the present invention, the guide plate may be disposed both on the one side and the other side of the first direction, with respect to the center of the storage tank, and a pair of the guide plates may be symmetric with reference to a vertical plane that passes the center of the storage tank in the first direction and extends along a second direction orthogonal to the first direction.

In this case, as compared with a case in which the number of guide plate(s) is one, it can be more effectively prevented that water generated by dew condensation of vapor is combined with air, whereby air humidity can be stably controlled.

According to the present invention, water generated by dew condensation of vapor can be prevented from being combined with air, so that an air humidity can be stably controlled.

DETAILED DESCRIPTION OF THE INVENTION

An embodiment of the present invention is described in detail below, with reference to the attached drawings.

Overall Structure of Air Conditioner

Figure 1:
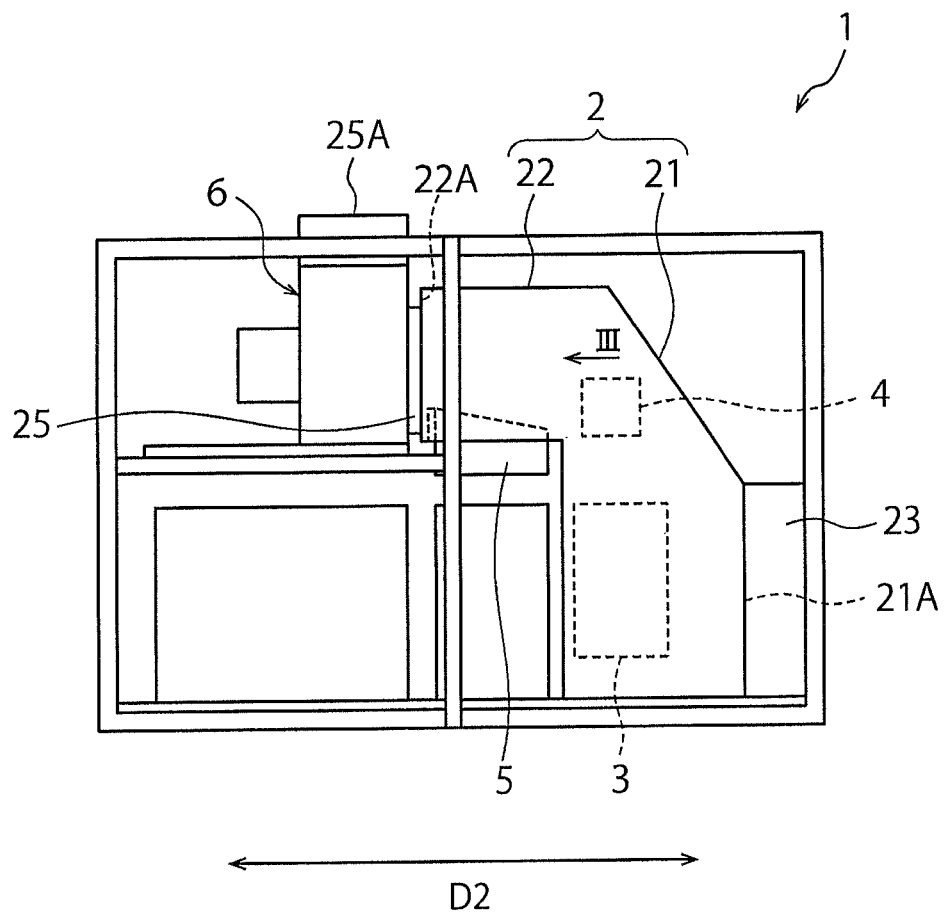
FIG. 1 is a side view of an air conditioner according to one embodiment of the present invention.

FIG. 1 is a side view of an air conditioner 1 according to an embodiment of the present invention. As shown in FIG. 1, the air conditioner 1 according to the embodiment comprises an air flow path 2 through which air flows, a cooler 3, a heating unit 4 and a humidifier 5, which are disposed in the air flow path 2, and a blower 6 that creates a driving force for allowing air to flow through the air flow path 2. The air flow path 2 has a vertical channel 21 that extends vertically, and a horizontal channel 22 that communicates with an upper part of the vertical channel 21 and extends horizontally from the upper part. In the below description, a direction orthogonal to a sheet plane of FIG. 1 along the horizontal direction is referred to as "first direction D1", and a direction orthogonal to the first direction D1 along the horizontal direction is referred to as "second direction D2" which is shown by an arrow in FIG. 1. The horizontal channel 22 extends along the second direction D2.

The vertical channel 21 is provided with, in a lower part thereof, an upstream opening 21A that is opened along the horizontal direction. In this embodiment, the upstream opening 21A is opened from the inside of the vertical channel 21 toward one side (right side in FIG. 1) of the second direction D2. The upstream opening 21A is provided for taking air to the inside of the vertical channel 21. In this embodiment, a filter device 23 disposed outside the upstream opening 21A covers the upstream opening 21A. Thus, air from which particles have been removed by the filter device 23 is taken from the upstream opening 21A to the inside of the vertical channel 21. In the below description, a direction referred to as one side of the second direction D2 means the right direction in FIG. 1, and a direction referred to as the other side of the second direction D2 means the left direction in FIG. 1.

Figure 2:
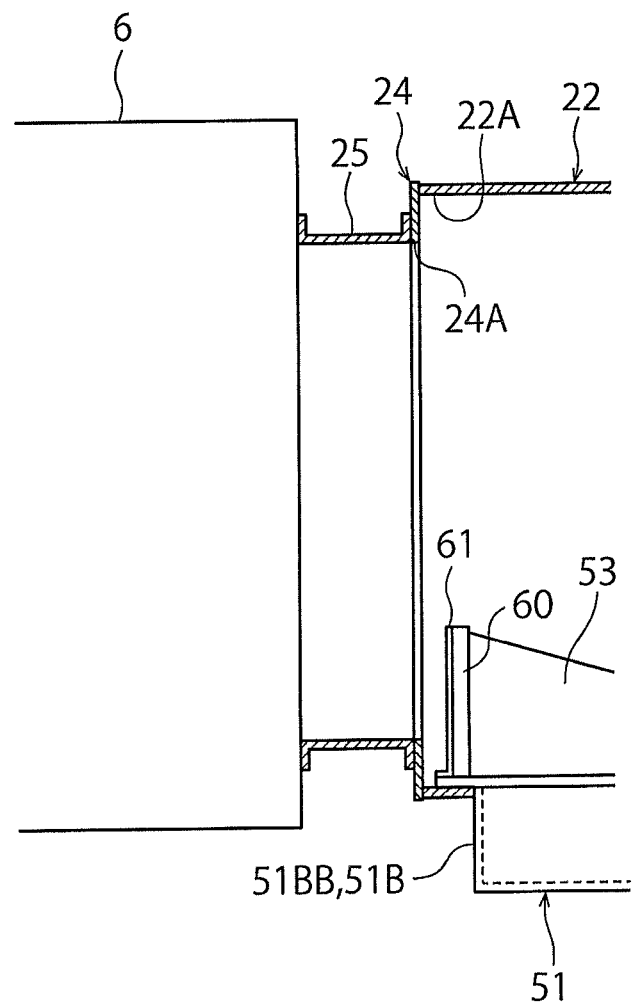
FIG. 2 is a sectional view of a part around a downstream opening of an air flow path of the air conditioner of FIG. 1.

The horizontal channel 22 is provided with a downstream opening 22A at an end opposite to the vertical channel 21, i.e., at an end on the other side of the second direction D2. FIG. 2 shows a longitudinal sectional view of a part around the downstream opening 22A of the horizontal channel 22 in the air flow path 2, in a plane along the second direction D2. As shown in FIG. 2, in this embodiment, a plate 24 with an air through hole 24A is installed in or attached to the downstream opening 22A. The plate 24 is installed to cover the downstream opening 22A with an area thereof in which the air through hole 24A is not formed. The air through hole 24A is formed to be smaller than the downstream opening 22A. Thus, in this embodiment, the air, which has been taken from the upstream opening 21A to the inside of the air flow path 2, is sent to the outside of the air flow path 2 from the air through hole 24A of the plate 24.

The plate 24 is formed of a plate member made of, e.g., stainless. In this embodiment, the plate 24 is fixed to the horizontal channel 22 by a screw. However, the plate 24 may be integrated with the horizontal channel 22 by welding, or the plate 24 and the horizontal channel 22 may be formed as a single piece made of one material. In addition, although the air through hole 24A is a circular hole (see FIG. 3), the air though hole 24A may have another shape such as a rectangular shape.

As shown in FIGS. 1 and 2, the blower 6 is located oppositely to the plate 24 in the second direction D2, and communicates with the air through hole 24A through a duct 25. When the blower 6 rotates a fan, not shown, the air inside the air flow channel 2 is taken into an inside thereof, and is then discharged from an outlet port 25A opened upward. Since the blower 6 takes thereinto the air inside the air flow path 2, outside air is taken from the upstream opening 21A to the inside of the air flow path 2. Thus, air flows through the air flow path 2.

As shown in FIG. 1, in this embodiment, a cooler 3 is disposed in a lower part of the vertical channel 21, and a heating unit 4 is disposed in an upper part of the vertical channel 21. The cooler 3 may be an evaporator in a cooling circuit in which a compressor, a condenser, an expansion valve and the evaporator are connected by pipes in this order so as to circulate a heat medium. In addition, the heating unit 4 may be an electric heater, or a heater that utilizes a part of the heat medium having a high temperature in the aforementioned cooing circuit. The cooler 3 can cool air inside the air flow path 2 by means of its variable refrigeration capacity, and the heating unit 4 can heat air inside the air flow path 2 by means of its variable heating capacity. The humidifier 5 is disposed in the horizontal channel 22, and can supply vapor into the air flow path 2.

Humidifier

Figure 3:
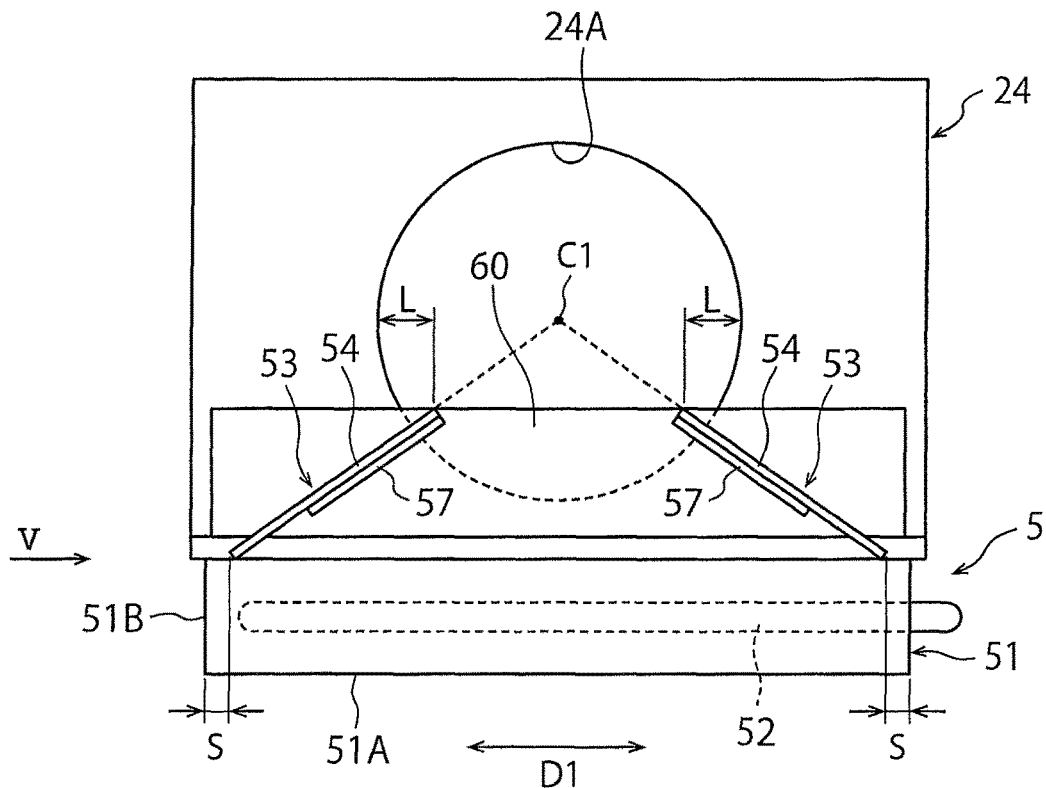
FIG. 3 is a view of a part around a humidifier disposed in the air flow path of the air conditioner of FIG. 1, when seen along a direction of an arrow III of FIG. 1 parallel with the horizontal direction.
Figure 4:
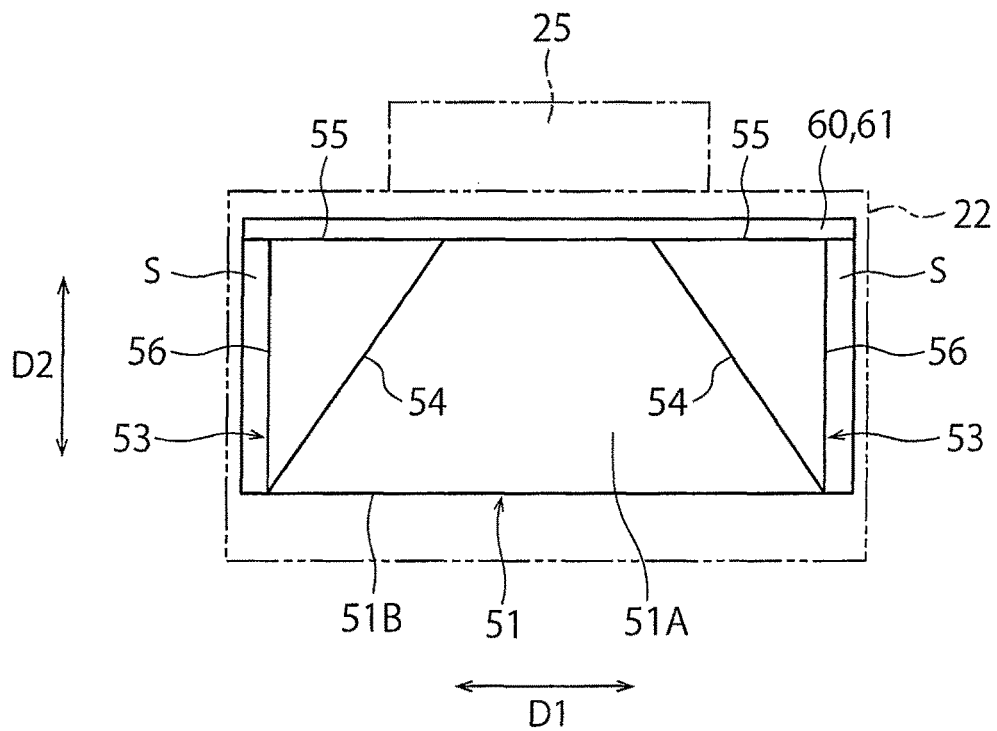
FIG. 4 is a top view of the humidifier shown in FIG. 3.
Figure 5:
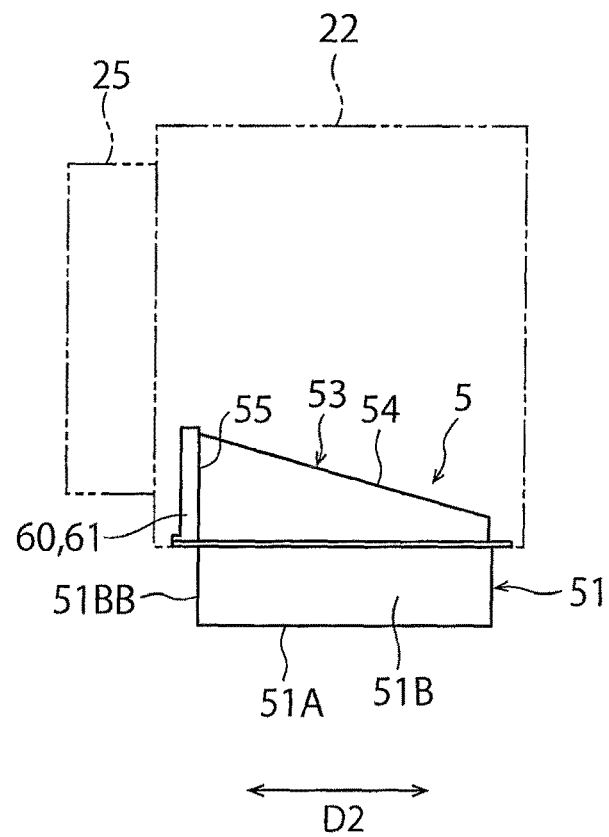
FIG. 5 is a view of the humidifier shown in FIG. 3, when seen along an arrow V of FIG. 3.
Figure 6:
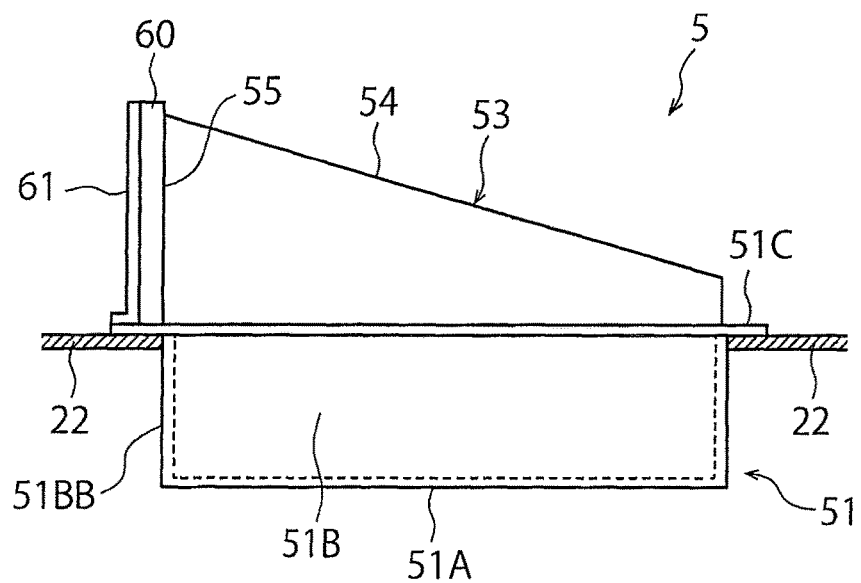
FIG. 6 is an enlarged view of a main part of FIG. 5.

Next, the humidifier 5 is described with reference to FIGS. 3 to 6. FIG. 3 is a view of a part around the humidifier 5 disposed in the air flow path 2, when seen along a direction of an arrow III of FIG. 1 parallel with the horizontal direction. In more detail, FIG. 3 is a view of the part around the humidifier 5, when seen from the inside of the air flow path 2 toward the other side of the second direction D2. FIG. 4 is a top view of the humidifier 5. In FIG. 4, the aforementioned horizontal channel 22 and the duct 25 are shown by the two-dot chain lines, for the purpose of illustration. FIG. 5 is a view of the humidifier 5, when seen along an arrow V of FIG. 3. In FIG. 5, the aforementioned horizontal channel 22 and the duct 25 are shown by the two-dot chain lines, for the purpose of illustration. FIG. 6 is an enlarged view of a main part of FIG. 5.

As shown in FIGS. 3 to 6, the humidifier 5 in this embodiment has a storage tank 51 that stores water, which is opened upward to the inside of the horizontal channel 22, a heater 52 that heats the water in the storage tank 51, and a pair of guide plates 53. The pair of guide plates 53 are located above the storage tank 51 respectively on one side and the other side of the first direction D1 extending along the horizontal direction, with respect to the center of the storage tank 51. Each guide plate 53 is inclined to extend such that an upper part thereof is positioned nearer to a center side of the storage tank 51 in the first direction D1 than a lower part thereof. In the humidifier 5 according to this embodiment, since the pair of guide plates 53 are located oppositely in the first direction D1, a direction, which is orthogonal to, in a horizontal plane, the direction in which the pair of guide plates 53 are opposed to each other, corresponds to the second direction D2. Thus, a direction, which is orthogonal to the direction in which the pair of guide plates 53 are opposed to each other, is parallel to a direction along which the horizontal channel 22 extends.

In the below description, a direction referred to as one side of the first direction D1 means the left direction in FIG. 3, and a direction referred to as the other side of the first direction D1 means the right direction of FIG. 3. In addition, a direction referred to as one side of the second direction D2 means the down direction in FIG. 4, and a direction referred to as the other side of the second direction D2 means the up direction in FIG. 4.

The storage tank 51 has a bottom wall 51A and a peripheral wall 51B that stands up from the whole area of an outer periphery of the bottom wall 51A. The bottom wall 51A and the peripheral wall 51B are formed of plate members made of, e.g., stainless. In the top view, the storage tank 51 has a rectangular shape having a longitudinal direction in the first direction D1. The peripheral wall 51B has a pair of wall parts that are positioned on the one side and the other side of the first direction D1, which correspond to a pair of short sides of the rectangular shape, and a pair of wall parts that are positioned on the one side and the other side of the second direction D2, which correspond to a pair of long sides of the rectangular shape. As to a positional relationship between the storage tank 51 and the air through hole 24A of the plate 24, as shown in FIG. 3, the air through hole 24A is positioned above the storage tank 51, when seen along the second direction D2.

In this embodiment, the storage tank 51 is disposed to pass through a lower wall of the horizontal channel 22. To be more specific, as shown in FIG. 6, the peripheral wall 51B is provided with a flange 51C extending outward. The storage tank 51 held on the lower wall of the horizontal channel 22 in such a manner that the flange 51C is locked on an outer periphery of an opening formed in the lower wall of the horizontal channel 22. In this embodiment, a part of the storage tank 51 is exposed outside the horizontal channel 22, but the humidifier 5 is accommodated as a whole inside the horizontal channel 22. As shown in FIG. 3, the heater 52 is accommodated inside the storage tank 51, and extends along the longitudinal direction of the storage tank 51. The humidifier 5 controls a heat value of the heater 52 to control an amount of vapor generated from the water stored in the storage tank 51, whereby a humidity of air flowing through the air flow path 2 can be controlled to a desired humidity.

The pair of guide plates 53 are formed of plate members made of, e.g., stainless, and are supported by support members, not shown, which stand up from the bottom wall 51A of the storage tank 51, so as to be maintained in a posture that is inclined with respect to the horizontal direction. In this embodiment, the pair of guide plates 53 are symmetrical with reference to a vertical plane which passes the center of the storage tank 51 in the first direction D1 and extends along the second direction D2. The upper parts of the pair of guide plates 53 are spaced apart from each other in the first direction in the first direction D1, so that vapor from the storage tank 51 can pass through the space between the upper parts of the pair of guide plates 53. In this embodiment, when seen along the second direction D2, the pair of guide plates 53 linearly extend, but they may curvilinearly extend.

As shown in FIG. 4, each of the pair of guide plates 53 have an inclined side part 54 which is positioned such that, in the top view, an end thereof on the one side of the second direction D2 is more distant from the center of the storage tank 51 in the first direction D1 than an end thereof on the other side of the second direction, the other side part 55 facing the other side of the second direction D2, and a lower side part 56 that is positioned on the side of the storage tank 51 in the up and down direction and extends along the second direction D2. In the illustrated example, the inclined side part 54, the other side part 55 and the lower side part 56 are connected to define a triangular shape in the top view.

Since the aforementioned plate 24 and the blower 6 are positioned on the other side of the second direction D2 with respect to the humidifier 5, the other side part 55 faces the side of the plate 24 and the blower 6. On the other hand, the inclined side part 54 is connected to an end of the other side part 55 on the center side of the storage tank 51 in the first direction D1, so as to face oppositely to the side of the plate 24 and the blower 6. As shown in FIG. 5, when seen along the first direction D1, the inclined side part 54 is inclined to extend diagonally upward toward the plate 24 and the blower 6.

As shown in FIG. 4, the other side part 55 in this embodiment extends along the first direction D1, so that the other side part 55 is parallel to a wall part 51BB of the storage tank 51 on the other side of the second direction D2. As shown in FIGS. 4 to 6, in the top view, the other side part 55 overlaps with the wall part 51BB of the storage tank 51 on the other side of the second direction D2. In this embodiment, in the top view, the other side part 55 overlaps with the wall part 51BB of the storage tank 51 on the other side of the second direction D2. However, in the top view, the other side part 55 may be positioned outside the wall part 51BB.

As shown in FIG. 3, the other side part 55 is provided with a projection 57 that projects downward and extends along the other side part 55. In this embodiment, the projection 57 and the guide plate 53 are formed as a single piece made of one material. However, the projection 57 may be fixed to the guide plate 53 by a screw, or may de fixed to the guide plate 53 by welding or the like.

On the other hand, as shown in FIGS. 3 and 4, each of the lower side parts 56 is apart from the wall part of the storage tank 51 on the side on which this guide plate 53 is positioned. Namely, in this embodiment, the guide plate 53 is disposed such that, in the top view, a gap S is formed between the guide plate 53 and the wall part of the storage tank 51 on the side on which this guide plate 53 is positioned in the first direction D1. In this embodiment, a float switch, not shown, is arranged to pass through the gap S between the guide plate 53, which is positioned on the other side of the first direction D1, and the wall part of the storage tank 51. Such a gap S may not be formed.

In addition, in this embodiment, as shown in FIG. 3, when seen along the second direction D2, a part of the guide plate 53 overlaps with the air through hole 24A of the plate 24. In addition, when seen along the second direction D2, a line extended diagonally upward from the upper part of the guide plate 53 passes through a center C1 of the air through hole 24A. It is preferable that the aforementioned extension line of the guide plate 53 passes through the center C1 of the air through hole 24A, and that the extension line defines an angle of 20° to 30° with respect to a straight line along the first direction D1. From the extensive studies, the present inventor has found that humidity control precision can be improved by setting an angle of the guide plate 53 within such an angular range. In this embodiment, when seen along the second direction D2, the guide plate 53 overlaps with the air through hole 24A of the plate 24. However, the guide plate 53 may not overlap with the air through hole 24A, and the upper part of the guide plate 53 may be positioned below the air through hole 24A.

In addition, as shown in FIG. 3, a distance L, in which the guide plate 53 projects from an end point of the air through hole 24A in the first direction D1 toward the center side of the air through hole 24A, is preferably $5/36$ to $10/36$ with respect to the diameter of the air through hole 24A. Particularly in this embodiment, the above distance is $6/36$ ($1/6$). From the extensive studies, the present inventor has found that humidity control precision can be improved by setting the position of the guide plate 53 within such a dimensional range.

On the other hand, the humidifier 5 further comprises a moisture absorption member 60 extending in the up and down direction, at a position above the wall part 51BB of the storage tank 51 on the other side (plate 24 side) in the second direction D2, or diagonally thereabove the other side of the second direction D2. As shown in FIG. 3, the moisture absorption member 60 is of a rectangular shape having a longitudinal direction in the first direction D1, and extends outward across the pair of guide plates 53 in the first direction D1. In addition, as shown in FIGS. 4 and 5, the moisture absorption member 60 is formed to have a plate-like shape.

When seen along the second direction D2, i.e., the extension direction of the horizontal channel 22, the moisture absorption member 60 covers a part of the air through hole 24A. In the illustrated example, the moisture absorption member 60 covers a part of the air through hole 24, the part ranging from a lower end of the air through hole 24A up to $1/3$ of the maximum length thereof in the up and down direction. In this embodiment, the moisture absorption member 60 covers a part of the air thought hole 24A. In more detail, the moisture absorption member 60 strides across a part of the air through hole 24A and the wall surface of the plate 24 so as to cover the part of the air through hole 24A and the wall surface of the plate 24. However, the moisture absorption member 60 may not cover the air through hole 24A. For example, the moisture absorption member 60 may cover only the wall surface of the plate 24, which is below the lower end of the air through hole 24A. In addition, the moisture absorption member 60 may cover a diagonally downward part of the air through hole 24A and the lateral wall surface of the plate 24.

In this embodiment, the moisture absorption member 60 is a sponge, and is supported by a plate-like support member 61 made of, e.g., stainless, which is shown in FIG. 6. In the illustrated example, the support member 61 extends along a surface of the moisture absorption member 60 on the side of the plate 24 so as to support the surface. The support member 61 is fixed on the flange 51C extending from the wall part 51BB of the storage tank 51 toward the plate 24, and extends upward. The sponge forming the moisture absorption member 60 is made of a synthetic resin which is preferably a polyurethane foam. In particular, the sponge forming the moisture absorption member 60 is preferably a soft polyurethane foam among polyurethane foams, and more preferably a polyether-based soft polyurethane foam. Since the moisture absorption member 60 made of a polyether-based soft polyurethane foam does not affect a semiconductor manufacturing step, such a moisture absorption member 60 is useful particularly in the manufacture of semiconductors. However, as long as the moisture absorption member 60 has moisture absorbency, the moisture absorption member 60 may be made of a material different from a sponge. For example, the moisture absorption member 60 may be made of a fibrous material such as cloth or a porous material.

Next, an operation of the embodiment is described.

In the air conditioner 1 according to this embodiment, the blower 6 rotates the fan so that air inside the air flow path 2 is taken to the inside of the blower 6, and the air is discharged from the outlet port 25A opened upward. Since the blower 6 takes thereinto the air inside the air flow path 2, outside air is taken from the upstream opening 21A of the air flow path 2 to the inside of the air flow path 2. Thus, the air flows through the air flow path 2. The air taken into the air flow path 2 is firstly cooled by the cooler 3, and is then heated by the heating unit 4 so as to be controlled to have a desired temperature. Thereafter, the air passes through above the humidifier 5, so that its humidity is controlled.

Figure 7:
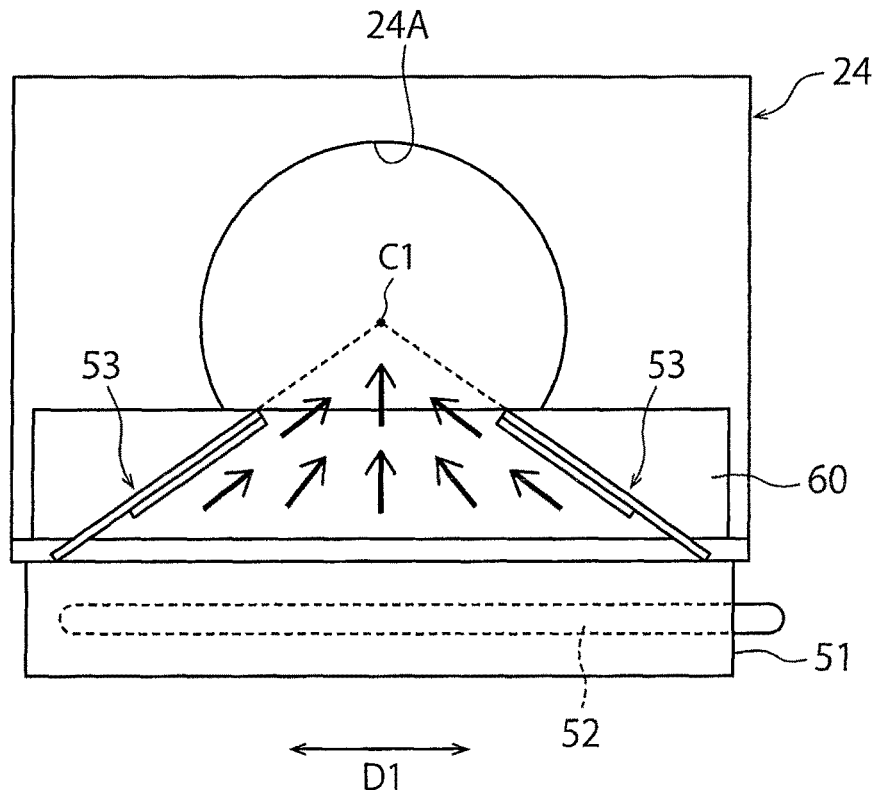
FIG. 7 is a view for describing an air flow above the humidifier in the air condition shown in FIG. 1.
Figure 8:
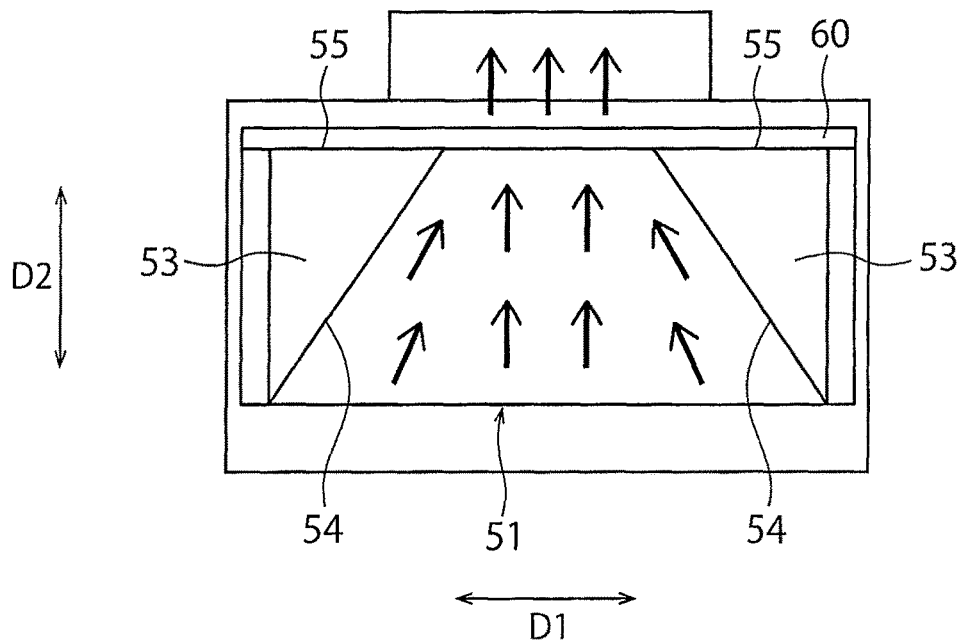
FIG. 8 is a view for describing an air flow above the humidifier in the air condition shown in FIG. 1.
Figure 9:
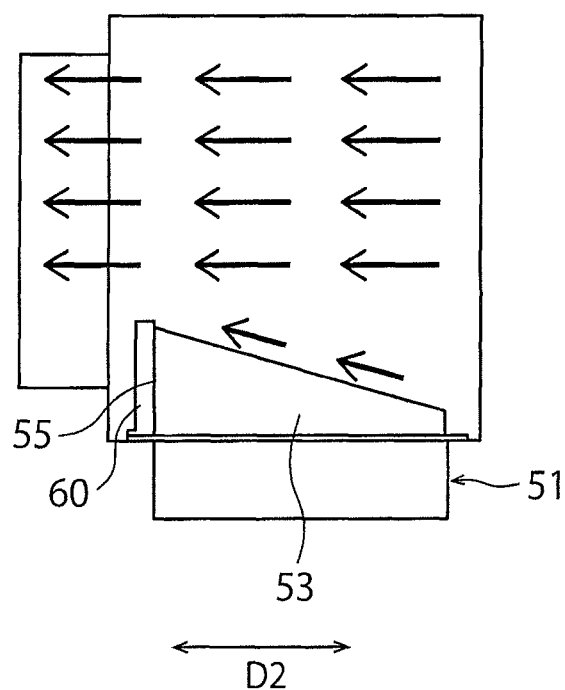
FIG. 9 is a view for describing an air flow above the humidifier in the air condition shown in FIG. 1.

FIGS. 7 to 9 show a flow of air passing through the humidifier 5 by arrows. The humidifier 5 allows air, which comes from a direction intersecting the first direction D1 on a horizontal plane in the horizontal channel 22 of the air flow path 2 to pass through above the storage tank 51, to be combined with vapor from the storage tank 51. As shown by the arrows in the respective drawings, the humidifier 5 enables the air combined with vapor to go outside the storage tank 51, while the air is guided by the guide plates 53 toward the center side of the storage tank 51.

Thus, under a state in which the humidifier 5 is set such that the air through hole 24A of the plate 24 is positioned on the extension lines of the guide plates 53 when seen along a direction orthogonal to the first direction D1 on a horizontal plane, i.e., along the second direction D2, the air combined with vapor can be gathered in the air through hole 24A of the plate 24. On the other hand, it can be prevented that the air combined with vapor diffuses broadly and condenses on an undesired area, specifically, an area around the air through hole 24A of the plate 24.

In addition, a part of the vapor from the storage tank 51 can be held in a water condition by the moisture absorption member 60, whereby it can be prevented that the vapor condenses around the air through hole 24A of the plate 24. In particular, vapor coming from the storage tank 51 on the side of the plate 24 is likely to be combined with air so as to adhere to the periphery of the air thought hole 24A to form dew drops. However, since the moisture absorption member 60 is positioned on the side of the plate 24 of the storage tank 51, dew condensation of vapor can be efficiently prevented.

Thus, according to the aforementioned embodiment, since it can be prevented that water generated by dew condensation of vapor is combined with air, air humidity can be stably controlled.

In addition, in this embodiment, in the top view, the guide plate 53 has the inclined side part 54 whose end on the one side of the second direction D2 is positioned more distant from the center of the storage tank 51 than its end on the other side of the second direction D2, and the plate 24 is positioned on the other side of the second direction D2 with respect to the humidifier.

Due to this structure, air combined with vapor is allowed to pass through the air through hole 24A of the plate 24 outside the storage tank 51, while the air combined with vapor is guided to the center side of the storage tank 51 along the inclined side parts 54. Thus, the air combined with vapor, which is present broadly in an area of the storage tank 51 on the one side of the second direction D1 can be supplied to the air through hole 24A. Thus, it can be effectively prevented that the air combined with vapor diffuses broadly, and undesired dew condensation of vapor can be effectively prevented.

In addition, the guide plate 53 has the other side part 55 that faces the other side of the second direction D2, and the other side part 55 extends along the first direction D1. Due to this structure, as compared with a case in which the other side part 55 is inclined with respect to the first direction D1, it can be better prevented that vapor from the storage tank 51 leaks outside from the other side part 55. Particularly in this embodiment, in the top view, the other side part 55 is overlapped with the wall part 51BB of the storage tank 55 on the other side of the second direction D2, or is positioned outside the wall part 51BB. Thus, it can be prevented that vapor from the storage tank 51 leaks outside from the other side part 55.

In addition, the other side part 55 is provided with the projection 57 that projects downward and extends along the other side part 55. Due to this structure, it can be effectively prevented that vapor from the storage tank 51 leaks outside from the other side part 55, and water generated by the vapor condensed on the lower surface of the guide plate 53 can be returned to the storage tank 51 from the lower end of the projection 57. In addition, since the guide plate 53 can be prevented from being bent and deformed by the projection 57, fluttering of the guide plate 53, which may be caused by flow of air, can be prevented.

In addition, the humidifier 5 further comprises the moisture absorption member 60 extending in the up and down direction, at a position above the wall part 51BB of the storage tank 51 on the other side of the second direction D1, or diagonally thereabove the other side of the second direction D2. Due to this structure, even when vapor from the storage tank 51 leaks outside from the other side part 55, the vapor can be held in a water condition by the moisture absorption member 60. Thus, it can be effectively prevented that the vapor that has leaked outside from the other side part 55 condenses and is combined with air to flow. Thus, air humidity can be more stably controlled.

In addition, the guide plate 53 is disposed such that, in the top view, the gap S is formed between the guide plate 53 and the wall part of the storage tank 51 on the side on which this guide plate 53 is positioned in the first direction D1. Due to this structure, a member such as a float switch can be arranged through the gap S between the guide plate 53 and the wall part of the storage tank 51 on the side on which this guide plate 53 is positioned. Further, while the gap is efficiently utilized, the humidifier 5 is arranged to be apart from the air through hole 24A of the plate 24 to which air is supplied to define a gap therebetween. Thus, even when vapor of the storage tank 51 condenses on an undesired area, flow of water into the air through hole 24A can be prevented.

In addition, when seen along the second direction D2, a part of the guide plate 53 is overlapped with the air through hole 24A. Due to this structure, air combined with vapor, which is guided by the guide plate 53, can be effectively prevented from spreading around the air through hole 24A of the plate 24. Thus, it can be prevented that water generated by dew condensation of vapor is combined with air.

In particular, when seen along the second direction D2, extension lines of the guide plates 53 pass the center C1 of the air through hole 24A. Due to this structure, air combined with vapor, which is guided by the guide plates 53, can be supplied toward the center of the air through hole 24A of the plate 24. Thus, the air combined with vapor can be effectively prevented from spreading around the air through hole 24A of the plate 24. As a result, it can be prevented that water generated by dew condensation of vapor is combined with air.

The one embodiment of the present invention has been described above, but the present invention is not limited to the aforementioned embodiment. For example, in the above embodiment, the guide plate 53 is disposed on both side with respect to the center of the storage tank 51 in the first direction D1. However, the guide plate 53 may be provided on only one side with respect to the center of the storage tank 51.

1 Air conditioner
2 Air flow path
3 Cooler
4 Heating unit
5 Humidifier
6 Blower
21 Vertical channel
21 Upstream opening
22 Horizontal channel
22A Downstream opening
24 Plate
24A Air through hole
51 Storage tank
51A Bottom wall
51B Peripheral wall
51C Flange
52 Heater
53 Guide plate
54 Inclined side part
55 Other side part
56 Lower side part
57 Projection
60 Moisture absorption member
61 Support member

The invention claimed is:

1. A humidifier comprising:
a storage tank that stores water, the storage tank being opened upward;
a heater that heats the water in the storage tank; and
a guide plate that is disposed above the storage tank, on at least one of one side and the other side in a first direction extending along a horizontal direction with respect to a center of the storage tank,
wherein the guide plate extends in an inclined manner such that an upper part thereof is positioned closer to the center of the storage tank in the first direction than a lower part thereof, and
wherein the guide plate is open on both sides in a second direction that is orthogonal to the first direction in a horizontal plane.

2. The humidifier according to claim 1, wherein the guide plate has an inclined side part that is positioned such that, in a top view, an end thereof, which is on one side of the second direction that is orthogonal to the first direction in the horizontal plane, is more distant from the center of the storage tank in the first direction than an end thereof that is on the other side of the second direction.

3. The humidifier according to claim 2, wherein a second side part of the guide plate faces the other side of the second direction in the horizontal plane, and
wherein, in a top view, the second side part extends along the first direction.

4. The humidifier according to claim 3, wherein a wall part of the storage tank on the other side of the second direction extends along the first direction, and
wherein in a top view, the second side part is overlapped with the wall part or is positioned outside the wall part.

5. The humidifier according to claim 3, wherein the second side part is provided with a projection that projects downward and extends along the second side part.

6. The humidifier according to claim 1, wherein the guide plate is disposed such that, in a top view, a gap is defined between the guide plate and a wall part of the storage tank on a side on which the guide plate itself is positioned in the first direction.

7. The humidifier according to claim 1, wherein the guide plate is disposed on both the one side and the other side of the first direction, with respect to the center of the storage tank, and
wherein a pair of the guide plates are symmetric with reference to a vertical plane that passes the center of the storage tank in the first direction and extends along the second direction that is orthogonal to the first direction.

8. The humidifier according to claim 1, wherein the humidifier is configured to be disposed in an air conditioner comprising an air flow path through which air flows, and a plate installed in a downstream opening of the air flow path, the plate being provided with an air through hole, wherein the air flow path includes a horizontal channel, the horizontal channel being provided with the downstream opening and extending along the horizontal direction, such that the humidifier is installed on the horizontal channel, and
wherein the humidifier is configured to be installed such that the second direction that is orthogonal to the first direction in the horizontal plane is along an extension direction of the horizontal channel, and that a part of the guide plate is disposed to be overlapped with the air through hole when viewed along the second direction.

9. The humidifier according to claim 1, wherein the humidifier is configured to be disposed in an air conditioner comprising an air flow path through which air flows, and a plate installed in a downstream opening of the air flow path, the plate being provided with an air through hole, wherein the air flow path includes a horizontal channel, the horizontal channel being provided with the downstream opening and extending along the horizontal direction, such that the humidifier is installed on the horizontal channel, and
wherein the humidifier is configured to be installed such that the second direction that is orthogonal to the first direction in the horizontal plane is along an extension direction of the horizontal channel, and that an extension line of the guide plate is disposed to pass a center of the air through hole when seen along the second direction.

10. An air conditioner comprising:
an air flow path through which air flows;
a plate installed in a downstream opening of the air flow path, the plate being provided with an air through hole; and
a humidifier disposed on the air flow path and capable of supplying vapor into the air flow path;
wherein the air flow path has a horizontal channel provided with the downstream opening and extending along a horizontal direction,
wherein the humidifier is disposed on the horizontal channel,
wherein the humidifier has
a storage tank that stores water, the storage tank being opened upward,
a heater that heats the water in the storage tank, and
a guide plate that is disposed above the storage tank, on at least one of one side and the other side in a first direction extending along a horizontal direction with respect to a center of the storage tank, the guide plate extending in an inclined manner such that an upper part thereof is positioned closer to the center of the storage tank in the first direction than a lower part thereof, and
wherein the humidifier is configured to be installed such that a second direction, which is orthogonal to the first direction in a horizontal plane, is along an extension direction of the horizontal channel.

11. The air conditioner according to claim 10, wherein the guide plate has an inclined side part that is positioned such that, in a top view, an end thereof, which is on one side of the second direction orthogonal to the first direction in the horizontal plane, is more distant from the center of the storage tank in the first direction than an end thereof, which is on the other side of the second direction, and
wherein the plate is positioned on the other side of the second direction with respect to the humidifier.

12. The air conditioner according to claim 11, wherein a second side part of the guide plate faces the other side of the second direction, and
wherein the second side part extends along the first direction.

13. The air conditioner according to claim 12, wherein a wall part of the storage tank on the other side of the second direction extends along the first direction, and
wherein in a top view, the second side part is overlapped with the wall part or is positioned outside the wall part.

14. The air conditioner according to claim 12, wherein the second side part is provided with a projection that projects downward and extends along the second side part.

15. The air conditioner according to claim 12 further comprising:
a moisture absorption member that extends in an up and down direction, above a wall part of the storage tank on the other side of the second direction, or diagonally thereabove on the other side of the second direction.

16. The air conditioner according to claim 10, wherein the guide plate is disposed such that, in a top view, a gap is defined between the guide plate and a wall part of the storage tank on a side on which the guide plate itself is positioned in the first direction.

17. The air conditioner according to claim 10, wherein when seen along the second direction, a part of the guide plate is overlapped with the air through hole.

18. The air conditioner according to claim 10, wherein when seen along the second direction, an extension line of the guide plate passes a center of the air through hole.

19. The air conditioner according to claim 18, wherein the air through hole is circular,
wherein, when seen along the second direction, a part of the guide plate is overlapped with the air through hole, and
wherein a distance, in which the guide plate projects from an end point of the air through hole in the first direction toward the center of the air through hole in the first direction, is $5/36$ to $10/36$ with respect to a diameter of the air through hole.

20. The air conditioner according to claim 10, wherein the guide plate is disposed both on the one side and the other side of the first direction with respect to the center of the storage tank, and
wherein a pair of the guide plates are symmetric with reference to a vertical plane that passes the center of the storage tank in the first direction and extends along a second direction orthogonal to the first direction.

* * * * *